(12) United States Patent
Nitta et al.

(10) Patent No.: US 11,112,474 B2
(45) Date of Patent: Sep. 7, 2021

(54) MAGNETIC RESONANCE IMAGING APPARATUS AND MAGNETIC RESONANCE IMAGING METHOD

(71) Applicant: Canon Medical Systems Corporation, Otawara (JP)

(72) Inventors: Shuhei Nitta, Tokyo (JP); Naho Imamura, Nasushiobara (JP); Takahiro Ohmure, Otawara (JP); Hiroshi Takai, Nasushiobara (JP); Nobuyasu Ichinose, Otawara (JP); Yoshimori Kassai, Nasushiobara (JP)

(73) Assignee: Canon Medical Systems Corporation, Otawara (JP)

( * ) Notice: Subject to any disclaimer, the term of this patent is extended or adjusted under 35 U.S.C. 154(b) by 0 days.

(21) Appl. No.: 16/532,673

(22) Filed: Aug. 6, 2019

(65) Prior Publication Data
US 2020/0041593 A1    Feb. 6, 2020

(30) Foreign Application Priority Data

Aug. 6, 2018   (JP) .............................. JP2018-147795

(51) Int. Cl.
*G01V 3/00*     (2006.01)
*G01R 33/48*    (2006.01)
*G01R 33/54*    (2006.01)

(52) U.S. Cl.
CPC ....... *G01R 33/4828* (2013.01); *G01R 33/543* (2013.01)

(58) Field of Classification Search
CPC .............. G01R 33/543; G01R 33/5659; G01R 33/3415; G01R 33/36; A61B 5/055

USPC ........................................................ 324/309
See application file for complete search history.

(56) References Cited

U.S. PATENT DOCUMENTS

| 2011/0304331 | A1* | 12/2011 | Takahashi | ............ | G01R 33/483 |
|---|---|---|---|---|---|
| | | | | | 324/309 |
| 2012/0212223 | A1* | 8/2012 | Nishihara | .......... | G01R 33/4828 |
| | | | | | 324/309 |
| 2016/0192859 | A1* | 7/2016 | Shirai | .................... | A61B 5/015 |
| | | | | | 600/412 |
| 2016/0327623 | A1* | 11/2016 | Nakai | .................. | A61B 5/4875 |
| 2017/0363699 | A1* | 12/2017 | Ookawa | ............ | G01R 33/4831 |

FOREIGN PATENT DOCUMENTS

JP         07-327960 A     12/1995

* cited by examiner

*Primary Examiner* — Walter L Lindsay, Jr.
*Assistant Examiner* — Frederick Wenderoth
(74) *Attorney, Agent, or Firm* — Oblon, McClelland, Maier & Neustadt, L.L.P.

(57) ABSTRACT

According to one embodiment, a magnetic resonance imaging apparatus includes processing circuitry. The processing circuitry acquires a first resonance frequency distribution of a first tissue and a second resonance frequency distribution of a second tissue which is different from the first tissue. The processing circuitry calculates a center frequency of a frequency-selective pulse that suppresses or emphasizes either one of the first tissue and the second tissue in accordance with the first and second resonance frequency distributions. The processing circuitry collects a magnetic resonance signal after the frequency-selective pulse is applied at the calculated center frequency.

16 Claims, 4 Drawing Sheets

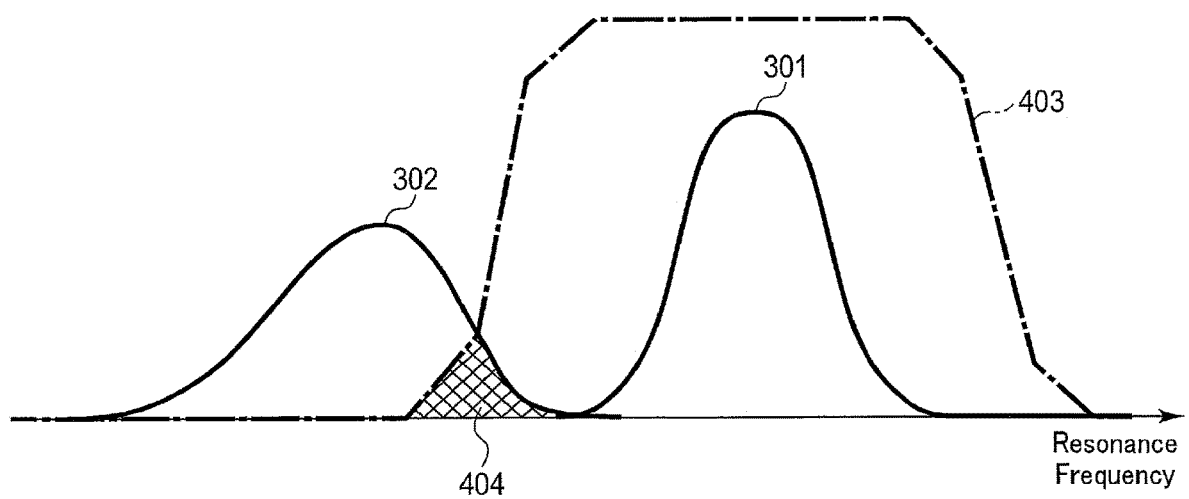
F I G. 5

MAGNETIC RESONANCE IMAGING APPARATUS AND MAGNETIC RESONANCE IMAGING METHOD

CROSS-REFERENCE TO RELATED APPLICATIONS

This application is based upon and claims the benefit of priority from the prior Japanese Patent Application No. 2018-147795, filed Aug. 6, 2018, the entire contents of which are incorporated herein by reference.

FIELD

Embodiments described herein relate generally to a magnetic resonance imaging apparatus and a magnetic resonance imaging method.

BACKGROUND

A technique relating to a magnetic resonance imaging (MRI) apparatus that performs shimming on a static magnetic field based on a static magnetic field distribution (hereinafter, referred to as "static magnetic field shimming"), is known. For example, an MRI apparatus optimizes a center frequency of a prepulse, and a center frequency of an RF pulse for each slice, by performing static magnetic field shimming during multi-slice imaging.

However, depending on a frequency characteristic of a fat suppression pulse used for imaging, even when the center frequencies are optimized, a fat suppression effect may be affected and may be thereby degraded. As a consequence, there may be cases where image quality of a magnetic resonance image is not improved.

BRIEF DESCRIPTION OF THE DRAWINGS

FIG. 5 is a diagram showing another example where penalty is set for optimization of center frequencies in the embodiment.

DETAILED DESCRIPTION

In general, according to one embodiment, a magnetic resonance imaging apparatus includes processing circuitry. The processing circuitry acquires a first resonance frequency distribution of a first tissue and a second resonance frequency distribution of a second tissue which is different from the first tissue. The processing circuitry calculates a center frequency of a frequency-selective pulse that suppresses or emphasizes either one of the first tissue and the second tissue in accordance with the first and second resonance frequency distributions. The processing circuitry collects a magnetic resonance signal after the frequency-selective pulse is applied at the calculated center frequency.

A magnetic resonance imaging (MRI) apparatus and a magnetic resonance imaging method according to the present embodiment will be described with reference to the accompanying drawings. In the embodiments described below, elements assigned with the same reference symbols perform the same operations, and redundant descriptions thereof will be omitted as appropriate.

Figure 1:
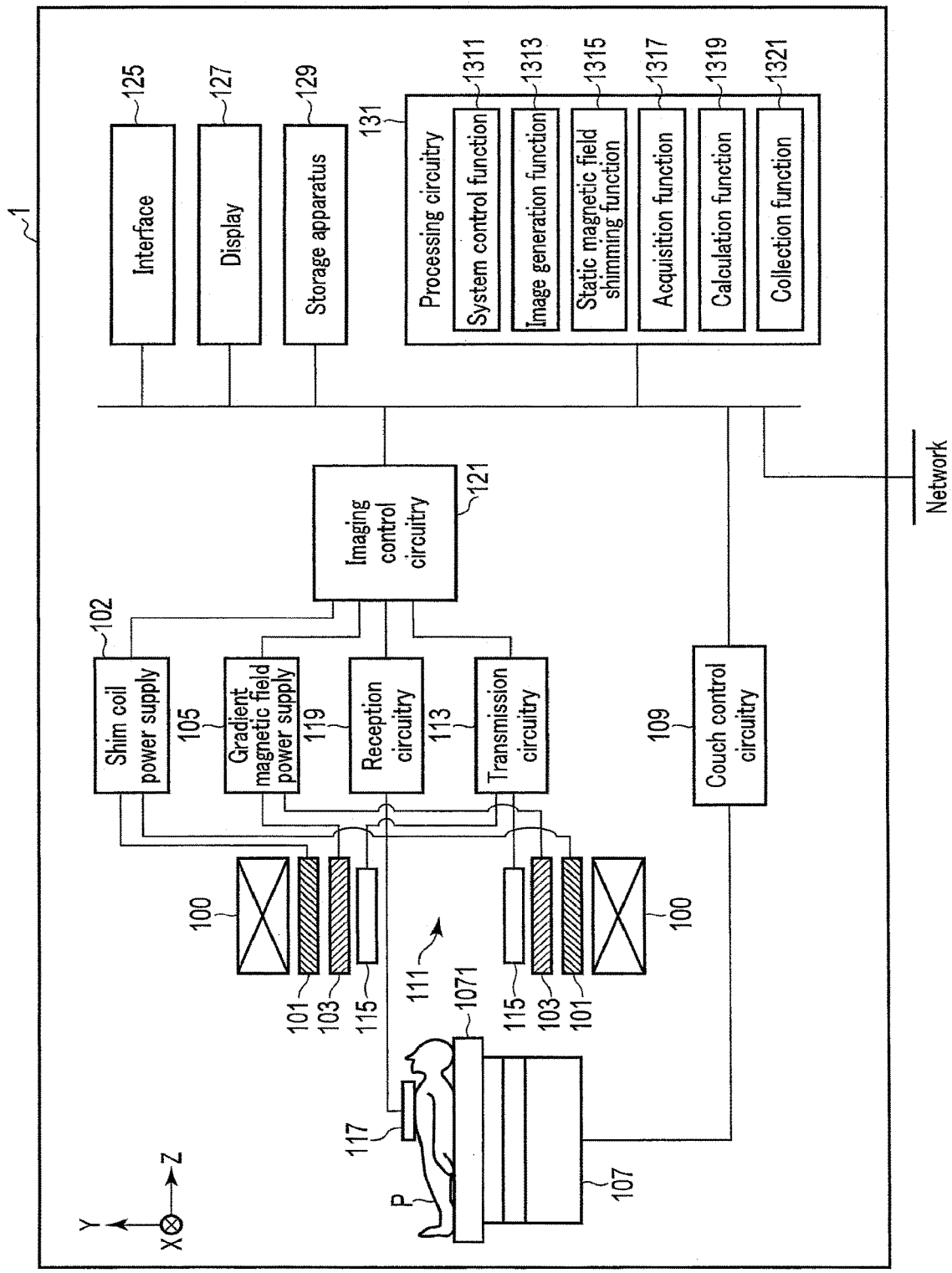
FIG. 1 is a diagram showing a configuration of a magnetic resonance imaging apparatus according to an embodiment.

FIG. 1 is a diagram showing a configuration of the magnetic resonance imaging apparatus 1 in the present embodiment. As shown in FIG. 1, the MRI apparatus 1 includes a static magnetic field magnet 100, a shim coil 101, a shim coil power supply 102, a gradient coil 103, a gradient magnetic field power supply 105, a couch 107, couch control circuitry 109, transmission circuitry 113, a transmitter coil 115, a receiver coil 117, reception circuitry 119, imaging control circuitry 121, an interface 125, a display 127, a storage apparatus 129, and processing circuitry 131. The couch control circuitry 109, the imaging control circuitry 121, the interface 125, the display 127, the storage apparatus 129, and the processing circuitry 131 are connected wirelessly or with wires for data transmission. A subject P is not included in the MRI apparatus 1.

The static magnetic field magnet 100 is a magnet formed in a hollow, approximately cylindrical shape. The static magnetic field magnet 100 generates an approximately uniform static magnetic field in the inner space. For example, a superconducting magnet or the like is used as the static magnetic field magnet 100. As shown in FIG. 1, the Z-axis direction is defined as the same as the orientation of the static magnetic field. In addition, the Y-axis direction is a vertical direction, and the X-axis direction is a direction perpendicular to each of the Z-axis and the Y-axis.

The shim coil 101 generates a correction magnetic field that corrects second-order or higher components of inhomogeneity of a static magnetic field generated by the static magnetic field magnet 100. The shim coil 101 is joined to an outer surface of the gradient coil 103 via a not-shown insulation layer. Generally, inhomogeneity of a static magnetic field is expressed by components, such as a 0-order component, first-order components $X^1$, $Y^1$, $Z^1$, and second-order components $X^2$, $Y^2$, $Z^2$, XY, YZ, ZX. There may be third-order or higher components in inhomogeneity of a static magnetic field. A multiple-order component is a second-order or higher component.

To simplify the description hereinafter, let us suppose a high-order component is a second-order component. In this case, the shim coil 101 has a second-order shim structure. In addition, the shim coil 101 has, for example, five coil patterns each corresponding to second-order components of inhomogeneity of a static magnetic field, ZX, XY, YZ, $(Z^2-(X^2+Y^2)/2)$, and $(X^2-Y^2)$. The five coil patterns of the shim coil 101 respectively generate a five-channel correction magnetic field for correcting the second-order components of inhomogeneity of the static magnetic field, ZX, XY, YZ, $(Z^2-(X^2+Y^2))$, and $(X^2-Y^2)$, in accordance with a current supplied from the shim coil power supply 102. When static magnetic field shimming is performed in consideration of the multiple-order components of inhomogeneity of the static magnetic field, the shim coil 101 has coil patterns in accordance with the multiple-order components. The static magnetic field shimming relating to the present embodiment will be described later.

The shim coil power supply 102 is a power supply apparatus that supplies a current to the shim coil 101 under the control of the imaging control circuitry 121. Specifically, the shim coil power supply 102 independently supplies a current to each of the five coil patterns in the shim coil 101.

In other words, the shim coil power, supply 102 supplies a current corresponding to a second-order shimming value determined by the static magnetic field shimming in the present embodiment to each of the five coil patterns in the shim coil 101.

The gradient coil 103 is a coil formed in a hollow, approximately cylindrical shape. The gradient coil 103 is arranged inside the shim coil 101. The gradient coil 103 is formed by combining three coils respectively corresponding to the X-, Y-, and Z-axes which are orthogonal to each other. These three coils in the gradient coil 103 are separately supplied with a current from the gradient magnetic field power supply 105, and respectively generate gradient magnetic fields in which magnetic field intensity changes along each of the X-, Y-, and Z-axes.

The gradient magnetic fields along each of the X-, Y-, and Z-axes generated by the gradient coil 103 respectively form, for example, a gradient magnetic field for frequency encoding (readout gradient field), a gradient magnetic field for phase encoding, and a gradient magnetic field for slice selection. The gradient magnetic field for slice selection is used to determine an imaging slice at will. The gradient magnetic field for phase encoding is used to change the phase of an MR signal in accordance with the spatial position. The gradient magnetic field for frequency encoding is used to change the frequency of an MR signal in accordance with the spatial position. In addition, the gradient magnetic fields of the X-, Y-, and Z-axes generated by the gradient coil 103 are used as offset of first-order shimming of a static magnetic field.

The gradient magnetic field power supply 105 is a power supply apparatus that supplies a current to the gradient coil 103 under the control of the imaging control circuitry 121. Specifically, the gradient coil corresponding to the X-axis generates, by the supply of a current from the gradient magnetic field power supply 105, a correction magnetic field having approximately the same magnetic field direction as the $X^1$ component of inhomogeneity of a static magnetic field, and a gradient magnetic field for frequency encoding. The gradient coil corresponding to the Y-axis generates, by the supply of a current from the gradient magnetic field power supply 105, a correction magnetic field having approximately the same magnetic field direction as the $Y^1$ component of inhomogeneity of a static magnetic field, and a gradient magnetic field for phase encoding. The gradient coil corresponding to the Z-axis generates, by the supply of a current from the gradient magnetic field power supply 105, a correction magnetic field having approximately the same magnetic field direction as the $Z^1$ component of inhomogeneity of a static magnetic field, and a gradient magnetic field for slice selection. In other words, three gradient magnetic field coils respectively corresponding to the X-, Y-, and Z-axes are used to correct first-order components of inhomogeneity of a static magnetic field, in addition to generation of a gradient magnetic field relating to imaging.

The couch 107 is an apparatus having a couch top 1071 on which a subject P is laid. The couch 107 inserts the couch top 1071 on which the subject P is laid into the bore 111 under the control of the couch control circuitry 109. The couch 107 is installed in, for example, an examination room in such a manner that the longitudinal axis of the couch 107 is parallel to the central axis of the static magnetic field magnet 100.

The couch control circuitry 109 is circuitry that controls the couch 107. The couch control circuitry 109 drives the couch 107 in accordance with an operator's instruction via the interface 125 to move the couch top 1071 in a longitudinal direction and a vertical direction.

The transmission circuitry 113 supplies a high-frequency pulse modulated by a Larmor frequency to the transmitter coil 115 under the control of the imaging control circuitry 121.

The transmitter coil 115 is an RF coil provided inside the gradient coil 103. The transmitter coil 115 generates an RF pulse corresponding to a radio frequency magnetic field in accordance with an output from the transmission circuitry 113. The transmitter coil 115 is, for example, a whole-body coil (WB coil) including a plurality of coil elements. The WB coil may be used as a transmitter/receiver coil. The transmitter coil 115 may also be a WB coil made of a single coil.

The receiver coil 117 is an RF coil provided inside the gradient coil 103. The receiver coil 117 receives MR signals that are emitted from the subject P, caused by a radio frequency magnetic field. The receiver coil 117 outputs the received MR signals to the reception circuitry 119. The receiver coil 117 is a coil array including, for example, one or more, typically, a plurality of coil elements. In FIG. 1, the transmitter coil 115 and the receiver coil 117 are illustrated as separate RF coils; however, the transmitter coil 115 and the receiver coil 117 may be realized by an integrated transmitter/receiver coil. The transmitter/receiver coil is, for example, a local transmitter/receiver RF coil, such as a head coil, to serve an imaging target in the subject P.

The reception circuitry 119 generates a digital MR signal (hereinafter referred to as "MR data") based on the MR signal that is output from the receiver coil 117 under the control of the imaging control circuitry 121. Specifically, the reception circuitry 119 performs various types of signal processing to the MR signal that is output from the receiver coil 117, and then performs analog-to-digital (A/D) conversion of data to which the variety of signal processing is performed. The reception circuitry 119 samples the A/D-converted data. The reception circuitry 119 thereby generates MR data. The reception circuitry 119 outputs the generated MR data to the imaging control circuitry 121.

The imaging control circuitry 121 controls, for example, the shim coil power supply 102, the gradient magnetic field power supply 105, the transmission circuitry 113, and the reception circuitry 119 in accordance with an imaging protocol that is output from the processing circuitry 131, and performs imaging on the subject P. An imaging protocol has different pulse sequences in accordance with a body part targeted for imaging and a type of examination. The imaging protocol defines the magnitude of the current supplied from the gradient magnetic field power supply 105 to the gradient coil 103, timing of the supply of the current from the gradient magnetic field power supply 105 to the gradient coil 103, the magnitude and pulse width of the high frequency pulse supplied from the transmission circuitry 113 to the transmitter coil 115, timing of the supply of the high frequency pulse from the transmission circuitry 113 to the transmitter coil 115, and timing of reception of the MR signal at the receiver coil 117, etc.

The interface 125 is realized by, in order to receive various instructions and information inputs from an operator, a switch button, a mouse, a keyboard, a touch pad with which an input operation can be performed by touching its operation screen, a touch screen in which a display screen and a touch pad are integrated, and non-contact input circuitry using an optical sensor, or sound input circuitry, etc. The interface 125, which is connected to the processing circuitry 131, etc., converts outputs an input operation received from the operator into an electric signal, and outputs the signal to the processing circuitry 131. In the present specification, the interface is not limited to physical operation components such as a mouse and a keyboard. For example, the interface 125 also includes electrical signal processing circuitry that receives an electrical signal corresponding to an input operation through an external input device provided independently from the apparatus, and outputs the electrical signal to the system control circuitry.

The display 127 displays, for example, various MR images generated by an image generation function 1313, and various types of information relating to imaging and image processing, under the control of a system control function 1311 in the processing circuitry 131. The display 127 is, for example, a CRT display, a liquid crystal display, an organic EL display, an LED display, a plasma display, or any other display or a monitor known in this technical field.

The storage apparatus 129 stores, for example, MR data filled in the k-space with the use of the image generation function 1313, image data generated by the image generation function 1313, imaging protocols, imaging conditions including the imaging parameters defining the imaging protocols, and the like. The storage apparatus 129 stores programs corresponding to various functions executed by the processing circuitry 131. The storage apparatus 129 stores a program for calculating a 0-order shimming value, first-order shimming values, and second-order shimming values based on static magnetic field shimming in the present embodiment (hereinafter, a calculation program).

The 0-order shimming value corresponds to a resonance frequency of water in each of the slices in a collection region of multi-slice collection. In other words, the 0-order shimming value relates to correction of the 0-order components of inhomogeneity of the static magnetic field in each of the slices in the collection region. The first-order shimming values correspond to values of currents respectively supplied to the three gradient coils from the gradient magnetic power supply 105 so as to correct the $X^1$, $Y^1$, and $Z^1$ components of inhomogeneity of the static magnetic field in each of the slices relating to the multi-slice collection. In other words, the first-order shimming value relates to correction of the first-order components of inhomogeneity of the static magnetic field in each of the slices in the collection region. The second-order shimming values correspond to values of currents respectively supplied to the five coil patterns in the shim coil 101 from the shim coil power supply 102 so as to correct the ZX, XY, YZ, $(Z^2-(X^2+Y^2)/2)$, $(X^2-Y^2)$ components of inhomogeneity of the static magnetic field in the entire collection region of the multi-slice collection. In other words, the second-order shimming value relates to correction of the second-order components of inhomogeneity of the static magnetic field in the entire collection region.

The storage apparatus 129 is, for example, a semiconductor memory element, such as a RAM (Random Access Memory) and a flash memory, a hard disk drive, a solid state drive, or an optical disk, etc. The storage apparatus 129 may also be, for example, a drive that performs reading and writing various kinds of information on a portable storage medium such as a CD-ROM drive, a DVD drive, or a flash memory.

The processing circuitry 131 includes, as hardware resources, a processor and a memory such as a ROM and a RAM, which are not shown, and controls the present MRI apparatus 1. The processing circuitry 131 includes a system control function 1311, an image generation function 1313, a static magnetic field shimming function 1315, an acquisition function 1317, a calculation function 1319, and a collection function 1321. The various types of functions executed by the system control function 1311, the image generation function 1313, the static magnetic field distribution generation function 1315, the acquisition function 1317, the calculation function 1319, and the collection function 1321, are stored in the storage apparatus 129 in a form of a computer-executable program. In this case, the processing circuitry 131 may be a processor which reads a program corresponding to each of those functions from the storage apparatus 129 and executes the program to realize the function corresponding to the program.

FIG. 1 illustrates the case where the various functions are realized in a single processor; however, the processing circuitry 131 may be constituted by a combination of a plurality of independent processors, and the functions may be realized by the processors executing the programs. In other words, each of the above-mentioned functions may be configured as a program, and executed by a single processing circuit; alternatively, a specific function may be implemented in a dedicated independent program-execution circuit. Although FIG. 1 illustrates the single storage apparatus 129 storing a program corresponding to each processing function, a plurality of storage apparatuses may be provided and the processing circuitry 131 may be configured to read a corresponding program from each storage apparatus.

The term "processor" used in the above description means, for example, a CPU (Central Processing Unit), a GPU (graphics processing unit), or circuitry such as an ASIC (application specific integrated circuit), or a programmable logic device (e.g., an SPLD (simple programmable logic device), a CPLD (complex programmable logic device), or a FPGA (field programmable gate array)).

The processor realizes various functions by reading and executing programs stored in the storage apparatus 129. A program may be directly integrated into the circuitry of the processor, instead of storing the program on the storage apparatus 129. In this case, the function is realized by reading and executing the program integrated into the circuitry. Similarly, each of the couch control circuitry 109, the transmission circuitry 113, the reception circuitry 119, and the imaging control circuitry 121, etc. are constituted by an electronic circuit, such as the above-described processor.

The processing circuitry 131 controls the MRI apparatus 1 by the system control function 1311. Specifically, the processing circuitry 131 reads the system control program stored in the storage apparatus 129, loads it in the memory, and controls each circuitry and each power supply of the present MRI apparatus 1 in accordance with the loaded system control program. For example, the processing circuitry 131 reads an imaging protocol from the storage apparatus 129 based on imaging condition that has been input by an operator through the interface 125. The processing circuitry 131 may also generate an imaging protocol based on conditions for imaging. The processing circuitry 131 transmits the imaging protocol to the imaging control circuitry 121, and controls imaging on the subject P.

By executing the image generation function 1313, the processing circuitry 131 fills MR data along a readout direction of k-space in accordance with, for example, an intensity of the readout gradient magnetic field. The processing circuitry 131 generates an MR image by executing an inverse Fourier transform to the MR data filled in k-space. The processing circuitry 131 outputs the generated MR image to the display 127 and the storage apparatus 129.

The above is the general description of the overall configuration of the MRI apparatus 1 according to the present embodiment.

Figure 2:
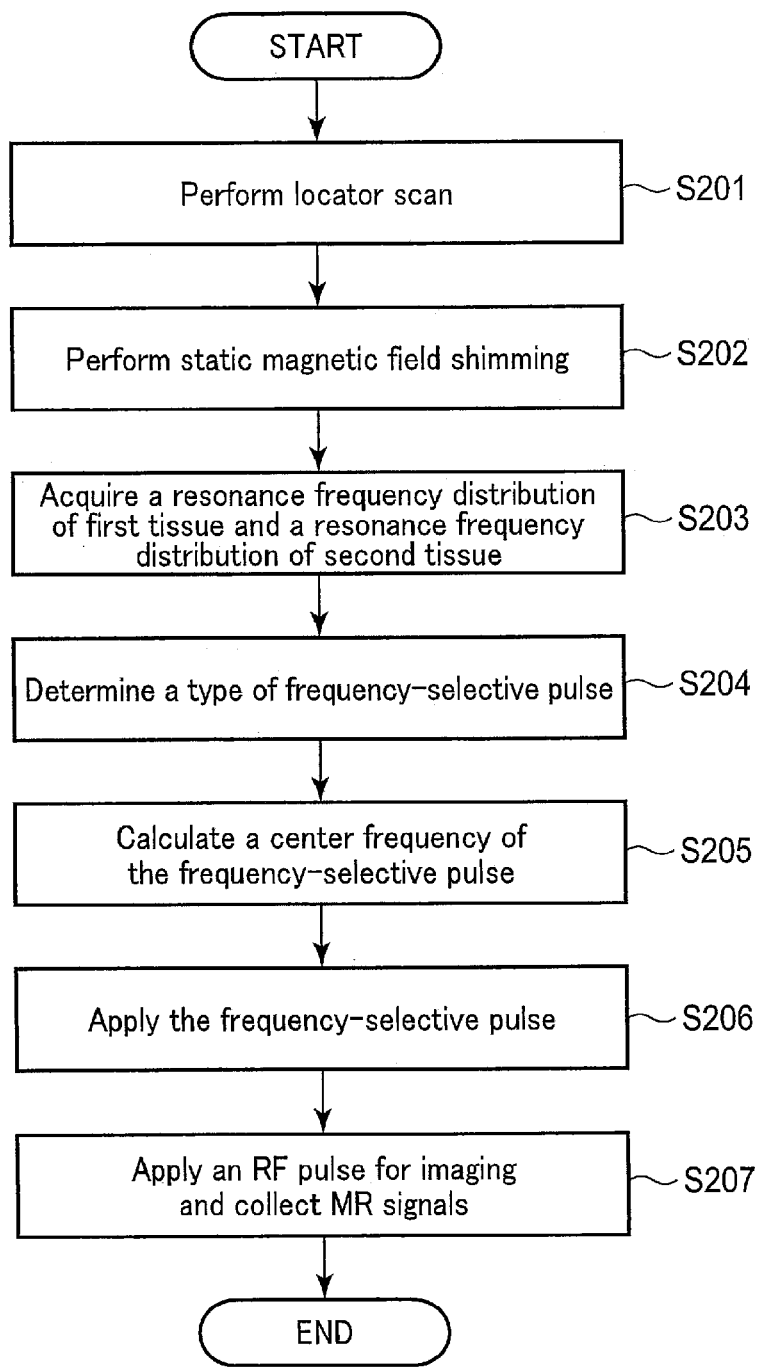
FIG. 2 is a flow chart showing an example of an operation of the magnetic resonance imaging apparatus according to the embodiment.

Next, the operation of the MRI apparatus 1 according to the present embodiment will be described with reference to the flow chart of FIG. 2.

In step S201, a locator scan is performed. Specifically, the imaging control circuitry 121 performs a locator scan in accordance with an instruction from the processing circuitry 131, for example. The processing circuitry 131 generates a locator image by using an MR signal collected by the locator scan. The processing circuitry 131 outputs the generated locator image to the display 127.

In step S202, by executing the static magnetic field shimming function 1315, the processing circuitry 131 performs static magnetic field shimming. The details of the static magnetic field shimming will be described later.

In step S203, by executing the acquisition function 1317, the processing circuitry 131 acquires a resonance frequency distribution of first tissue and a resonance frequency distribution of second tissue, which is different from the first tissue, in a range for imaging a subject. Hereinafter, the first tissue is water and the second tissue is fat in the present embodiment; however, the present embodiment is applicable to a combination of substances having different resonance frequencies, for example water and silicon.

In step S204, by executing the calculation function 1319, the processing circuitry 131 determines a type of a set frequency-selective pulse. A frequency-selective pulse is a pulse for suppressing or emphasizing first tissue or second tissue. As types of such frequency-selective pulse, a fat suppression method utilizing a difference in resonance frequencies between water and fat, for example, the chemical shift selective imaging (CHESS) method, the spectral pre-saturation with inversion recovery (SPIR) method, and the spectral attenuated inversion recovery (SPAIR) method, are known. As a selective water excitation method on the other hand, the binomial pulse method, the principle of selective excitation technique (PROSET) method, the polarity altered spectral-spatial selective acquisition (PASTA) method are known. As a non-selective fat suppression method utilizing a difference in T1 relaxation between water and fat, the short TI inversion recovery (STIR) method is known. Furthermore, the three-point Dixon method in which a phase difference between water and fat is used is also known.

By the calculation function 1319, the processing circuitry 131 determines a type of the frequency-selective pulse from, for example, sequence information included in an examination order. The type may be determined through a user's input of an imaging method (or a frequency-selective pulse) to be used, via the interface 125. For example, a type of frequency-selective pulse is displayed on the display 127, and a user may select a frequency-selective pulse on a touch panel, etc., so as to determine a type of frequency-selective pulse.

In step S205, by executing the calculation function 1319, the processing circuitry 131 calculates a center frequency of the frequency-selective pulse in accordance with the resonance frequency distributions calculated in step S203 and the type of frequency-selective pulse determined in step S204.

In step S206, by executing the collection function 1321, the processing circuitry 131 applies the frequency-selective pulse at the center frequency calculated in step S205.

In step S207, by executing the collection function 1321, the processing circuitry 131 applies an RF pulse for imaging at a center frequency of the RF pulse calculated in step S202 and collects MR signals. This concludes the operation of the MRI apparatus 1 according to the present embodiment.

Next, the details of the static magnetic field shimming performed in step S202 of the present embodiment will be described.

The imaging control circuitry 121 performs shimming imaging to a subject P. The imaging control circuitry 121 performs shimming imaging by, for example, multi-slice imaging adopting a double-echo method in which two different echo time intervals are used. The shimming imaging may be performed by other imaging methods, such as a multi-slice imaging method adopting a triple-echo method in which three different echo time intervals are used. Shimming imaging is performed to a three-dimensional first region, which is formed by slices corresponding to a plurality of cross sections in the region of the locator image. Specifically, the imaging control circuitry 121 controls the gradient magnetic power supply 105, the transmission circuitry 113, and the reception circuitry 119, in accordance with the double-echo method. The imaging control circuitry 121 collects MR signals corresponding to two echo time intervals via the receiver coil 117 and the reception circuitry 119 by shimming imaging.

The processing circuitry 131 generates, by the static magnetic field shimming function 1315, a plurality of static magnetic field distributions respectively corresponding to a plurality of slices in the second region, based on the MR signals collected by the shimming imaging. Specifically, the processing circuitry 131 generates two complex images respectively corresponding to the two echo time intervals, based on the MR signals of the slices in the second region. The processing circuitry 131 performs complex conjugate calculation to one of the two complex images, and calculates a product of the complex image to which complex conjugate calculation has been performed and the other complex image to which complex conjugate calculation has not been performed. The processing circuitry 131 generates a phase difference image by using a phase of the calculated product.

The processing circuitry 131 generates, by the static magnetic field shimming function 1315, an intensity image by using at least one of the two complex images. The processing circuitry 131 extracts a background region in the phase difference image based on the intensity image. The processing circuitry 131 removes the background from the phase difference image by using the extracted background region. The processing circuitry 131 performs a phase unwrap process in consideration of continuity of phase to the phase difference image from which the background has been removed. The processing circuitry 131 performs linear conversion to a value of the phase difference in each pixel in the phase difference image to which the phase unwrap processing has been performed, by using an echo interval corresponding to a difference of the two echo time intervals and a gyromagnetic ratio, thereby generating a two-dimensional static magnetic field distribution as frequency information. The processing circuitry 131 generates a three-dimensional static magnetic field distribution (hereinafter, "pre-shimming distribution") by coupling multiple two-dimensional static magnetic field distributions. The pre-shimming distribution may be stored in the storage apparatus 129 as default setting, in accordance with a body part targeted for imaging, sex, age, and so on. In this case, the shimming imaging is unnecessary.

The processing circuitry 131 performs, by the static magnetic field shimming function 1315, per-slice static magnetic field shimming to each of the slices respectively corresponding to the positions of the cross sections in the first region, by using the positions of the cross sections in the first region and the pre-shimming distribution. Specifically, the processing circuitry 131 reads, by the static magnetic field shimming function 1315, a calculation program from the storage apparatus 129, and develops it in own memory. The processing circuitry 131 calculates 0-order, first-order, and second-order shimming values for each of the slices in the first region with the use of the calculation program. The processing circuitry 131 associates the calculated 0-order, first-order, and second-order shimming values with a slice corresponding to the position of the displayed cross section. A basic expression of the static magnetic field shimming will be described below, and the per-slice static magnetic field shimming will be then be described.

An example of basic expression relating to the static magnetic field shimming is shown in the expression (1) below.

$$b'_0(x,y,z)=a_0+a_1x+a_2y+a_3z+b_0(x,y,z) \quad (1)$$

In the expression (1), x, y, and z are variables to represent three-dimensional positions in a space.

Specifically, the variable x represents a position with respect to a center of the static magnetic field in the horizontal direction (X-axis) (hereinafter "magnetic field center"), which is defined as an origin. The variable y represents a position with respect to the magnetic field center in the vertical direction (Y-axis) as an origin. The variable z represents a position with respect to the magnetic field center in the axial direction (Z-axis) as an origin. Herein, a unit of each of x, y, z is [m]. $a_0$ in the expression (1) is a 0-order shimming value. $a_0$ represents a value to which a minus sign is put to a center frequency of an RF pulse. A unit of $a_0$ is [ppm]. $a_1$, $a_2$, and $a_3$ in the expression (1) is first-order shimming values.

Specifically, $a_1$, $a_2$, and $a_3$ represent an amount of change in a resonance frequency per unit length for each of the X-, Y-, and Z-axes, respectively. An amount of change in a resonance frequency per unit length corresponds to a gradient of the gradient magnetic field, in other words, a value of current applied to the gradient coil 103. Herein, a unit of $a_1$, $a_2$, and $a_3$ is [ppm/m]. $b_0(x,y,z)$ in the expression (1) is a resonance frequency in the position (x,y,z) before the static magnetic field shimming is performed. In other words, $b_0(x,y,z)$ is a result of converting a three-dimensional static magnetic field distribution corresponding to the aforementioned pre-shimming distribution into a resonance frequency, that is a distribution of resonance frequency representing inhomogeneity of a static magnetic field. A unit of $b_0'(x,y,z)$ is [ppm]. $b_1'(x,y,z)$ is a difference value representing a difference between a resonance frequency in the position (x,y,z) after shimming and a center frequency of an RF pulse. A unit of $b_0'(x,y,z)$ is [ppm].

The left side of the expression (1), namely the difference value regarding the resonance frequency after shimming and the center frequency of the RF pulse becomes a desirable condition for static magnetic field shimming, if the value is smaller. If a set of all positions of a plurality of pixels in a foreground region (hereinafter, foreground pixels) corresponding to a non-foreground region (hereinafter, a position set S) is considered for an image representing the pre-shimming distribution, the position set S can expressed by the expression (2) below:

$$S \in \{(x_i,y_i,z_i)^T\}, i=1,2,\ldots,N \quad (2)$$

In the expression (2), i represents a serial number of a foreground pixel. N represents a total number of the foreground pixels.

At this time, N expressions (1) can be held for all the foreground pixels in the image of the pre-shimming distribution. If the N expressions (1) for all the foreground pixels are combined, the expression (3) below can be obtained:

$$\begin{pmatrix} b'_0(x_1,y_1,z_1) \\ \vdots \\ b'_0(x_N,y_N,z_N) \end{pmatrix} = \begin{pmatrix} 1 & x_1 & y_1 & z_1 \\ \vdots & \vdots & \vdots & \vdots \\ 1 & x_N & y_N & z_N \end{pmatrix} \begin{pmatrix} a_0 \\ a_1 \\ a_2 \\ a_3 \end{pmatrix} + \begin{pmatrix} b_0(x_1,y_1,z_1) \\ \vdots \\ b_0(x_N,y_N,z_N) \end{pmatrix} \quad (3)$$

In the expression (3), if a vector b', a matrix X, a vector a, and a vector b are defined as follows:

$$b' = \begin{pmatrix} b'_0(x_1,y_1,z_1) \\ \vdots \\ b'_0(x_N,y_N,z_N) \end{pmatrix}, X = \begin{pmatrix} 1 & x_1 & y_1 & z_1 \\ \vdots & \vdots & \vdots & \vdots \\ 1 & x_N & y_N & z_N \end{pmatrix},$$

$$a = \begin{pmatrix} a_0 \\ a_1 \\ a_2 \\ a_3 \end{pmatrix}, b = \begin{pmatrix} b_0(x_1,y_1,z_1) \\ \vdots \\ b_0(x_N,y_N,z_N) \end{pmatrix}$$

the expression (3) can then be expressed as shown in the expression (4) below:

$$b'=Xa+b \quad (4)$$

As aforementioned, the smaller each element of the vectors in the left side of the expression (1), namely, the left side of the expression (3) or (4), is, the more ideal it becomes for the static magnetic field shimming. Accordingly, homogeneity of the static magnetic field is defined as an amplitude of the vector b', and the cost function E regarding the vector a, which is obtained by combining 0-order shimming values and first-order shimming values, is defined as the expression (5).

$$E(a)=(Xa+b)^T \Omega^{-1}(Xa+b) \quad (5)$$

The matrix $\Omega$ in the expression (5) is a matrix for normalization in accordance with the importance of each element in the vector b' and correlation between the elements. For example, if the matrix $\Omega$ s a unitary matrix, the cost function is simply a sum of squares of a vector element. If the matrix $\Omega$ is a covariance matrix relating to the vector b', the cost function is a square of Mahalanobis' distance. The vector a, which is a combination of the 0-order shimming value and first-order shimming values, that minimizes the cost function (5) can be determined by the expression (6) shown below with the use of a least-squares method.

$$\hat{a}=\mathrm{argmin}_a E(a) \quad (6)$$

The per-slice static magnetic field shimming will be described below. Let us suppose a set of positions, $S_j$, of a plurality of foreground pixels per slice in the first region for the first region (in which per-slice static magnetic field shimming is performed), the position set $S_j$ can be expressed by the expression (7) below, for example:

$$S_j \in \{(x_i,y_i,z_i)^T\}, j=1,2,\ldots,M, i=1,2,\ldots,N_j \quad (7)$$

In the expression (7), j represents a serial number of the slices of the first region. M in the expression (7) represents the number of slices in the first region. i in the expression (7) represents a serial number of a foreground pixel. $N_j$ represents the total number of the foreground pixels in a slice j.

In the per-slice static magnetic field shimming, $N_j$ expressions (1) can be established for all the foreground pixels $N_j$ for each slice j in the first region. In slice j, a vector bj', a matrix Xj, a vector aj, and a vector bj are defined as follows:

$$b'_j = \begin{pmatrix} b'_0(x_1, y_1, z_1) \\ \vdots \\ b'_0(x_{N_j}, y_{N_j}, z_{N_j}) \end{pmatrix}, X_j = \begin{pmatrix} 1 & x_1 & y_1 & z_1 \\ \vdots & \vdots & \vdots & \vdots \\ 1 & x_{N_j} & y_{N_j} & z_{N_j} \end{pmatrix},$$

$$a_j = \begin{pmatrix} a_0(j) \\ a_1(j) \\ a_2(j) \\ a_3(j) \end{pmatrix}, b_j = \begin{pmatrix} b_0(x_1, y_1, z_1) \\ \vdots \\ b_0(x_{N_j}, y_{N_j}, z_{N_j}) \end{pmatrix}$$

The vector $b_j$ corresponds to the entire foreground pixels in the static magnetic field distribution corresponding to the slice j, among the plurality of static magnetic field distributions related to the aforementioned pre-shimming distribution. In the slice j, if the $N_j$ expressions (1) for all the foreground pixels are combined, the expression (8) below can be obtained:

$$b'_j = X_j a_j + b_j \quad (8)$$

For the expression (8), by executing the static magnetic field shimming function 1315, the processing circuitry 131 defines a cost function similarly to the expression (5). Thus, M patterns of the vector $a_j$, which is a combination of the 0-order shimming and first-order shimming values, can be calculated. In other words, by performing shimming using a value of $a_j$ for each slice j of the multiple slices, examination image collection by per-slice static magnetic field shimming can be realized.

Next, a basic expression relating to the second-order shimming using a shim coil capable of applying a two-dimensional correction magnetic field distribution in terms of space is shown as the expression (9) below:

$$b'_0(x, y, z) = a_0 + a_1 x + a_2 y + a_3 z + a_4 zx + a_5 xy + \quad (9)$$
$$a_6 yz + a_7 \left(z^2 - \frac{x^2 + y^2}{2}\right) + a_8(x^2 - y^2) + b_0(x, y, z)$$

The elements, x, y, z, $a_0$, $a_1$, $a_2$, $a_3$, $b_0$, and $b_0'$ in the expression (9) are defined similar to those in the expression (1). $a_4$, $a_5$, $a_6$, $a_7$, and $a_8$ are second-order shimming values. Specifically, each of $a_4$, $a_5$, $a_6$, $a_7$, and $a_8$ represents an amount of change in a spatially non-linear resonance frequency. An amount of change in a spatially non-linear resonance frequency corresponds to a value of a current applied to the shim coil 101. Herein, a unit of $a_4$, $a_5$, $a_6$, $a_7$, and $a_8$ is [ppm/m²].

In this case, N expressions (9) can be established for all the foreground pixels within the three-dimensional static magnetic field distribution image, and they can be combined as the expression (10) shown below:

$$\begin{pmatrix} b'_0(x_1, y_1, z_1) \\ \vdots \\ b'_0(x_N, y_N, z_N) \end{pmatrix} = \quad (10)$$

$$\begin{pmatrix} 1 & x_1 & y_1 & z_1 & z_1 x_1 & x_1 y_1 & y_1 z_1 & z_1^2 - \frac{x_1^2 + y_1^2}{2} & x_1^2 - y_1^2 \\ \vdots & \vdots & \vdots & \vdots & \vdots & \vdots & \vdots & \vdots & \vdots \\ 1 & x_N & y_N & z_N & z_N x_N & x_N y_N & y_N z_N & z_N^2 - \frac{x_N^2 + y_N^2}{2} & x_N^2 - y_N^2 \end{pmatrix}$$

$$\begin{pmatrix} a_0 \\ a_1 \\ a_2 \\ a_3 \\ a_4 \\ a_5 \\ a_6 \\ a_7 \\ a_8 \end{pmatrix} + \begin{pmatrix} b_0(x_1, y_1, z_1) \\ \vdots \\ b_0(x_N, y_N, z_N) \end{pmatrix}$$

In the expression (10), a vector b', a vector a, a vector b, a matrix X, a matrix X', and a matrix X" are defined as follows:

$$b' = \begin{pmatrix} b'_0(x_1, y_1, z_1) \\ \vdots \\ b'_0(x_N, y_N, z_N) \end{pmatrix}, a' = \begin{pmatrix} a_0 \\ a_1 \\ a_2 \\ a_3 \\ a_4 \\ a_5 \\ a_6 \\ a_7 \\ a_8 \end{pmatrix},$$

$$b = \begin{pmatrix} b_0(x_1, y_1, z_1) \\ \vdots \\ b_0(x_N, y_N, z_N) \end{pmatrix}, X = \begin{pmatrix} 1 & x_1 & y_1 & z_1 \\ \vdots & \vdots & \vdots & \vdots \\ 1 & x_N & y_N & z_N \end{pmatrix},$$

$$X' = \begin{pmatrix} z_1 x_1 & x_1 y_1 & y_1 z_1 & z_1^2 - \frac{x_1^2 + y_1^2}{2} & x_1^2 - y_1^2 \\ \vdots & \vdots & \vdots & \vdots & \vdots \\ z_N x_N & x_N y_N & y_N z_N & z_N^2 - \frac{x_N^2 + y_N^2}{2} & x_N^2 - y_N^2 \end{pmatrix},$$

$$X'' = (X \quad X')$$

the expression (10) can then be expressed as shown in the expression (11) below:

$$b' = X'' a' + b \quad (1.1)$$

Since the equation (11) has the same form as the expression (4) except for the matrix X" and the size of the vector a', the vector a', which is a combination of the 0-order, first-order, and second-order shimming values can be determined in a manner similar to the case of solving the equations (5) and (6).

The static magnetic field shimming in the present embodiment using the above-described 0-order, first-order, and second-order shimming values is formulated. Unlike with the 0-order and first-order shimming, it takes more time for the magnetic field to become stable in the second-order shimming after a current is applied to the shim coil 101; accordingly, it is difficult to rapidly switch the correction magnetic field per slice when multi-slice collection is performed. Thus, an object of the static magnetic field shimming in the present embodiment is to calculate an appropriate amount of correction per slice for the 0-order shimming and first-order shimming on the assumption that the second-order shimming is performed for all the slices in the collection region. To summarize the above, a basic expression of the static magnetic field shimming in the present embodiment can be expressed as the expression (12) below:

$$b' = X''' a'' + b \qquad (12)$$

In the expression (12), a vector b', a matrix X''', a vector a'', and a vector b are defined as follows:

$$b' = \begin{pmatrix} b'_1 \\ \vdots \\ b'_M \end{pmatrix}, X''' = \begin{pmatrix} X_1 & 0 & 0 & X' \\ 0 & \ddots & 0 & X' \\ 0 & 0 & X_M & X' \end{pmatrix}, a'' = \begin{pmatrix} a_1 \\ \vdots \\ a_M \\ a_3 \\ a_4 \\ a_5 \\ a_6 \\ a_7 \\ a_8 \end{pmatrix}, b = \begin{pmatrix} b_1 \\ \vdots \\ b_M \end{pmatrix}$$

The expression (12) has the same form as the expression (4). For this reason, the processing circuitry 131 can calculate, by the static magnetic field shimming function 1315, the vector a'', which is a combination of the 0-order and first-order shimming values of each slice in the collection region and the second-order shimming values of the entire collection region, in a manner similar to the case of solving the expressions (5) and (6). Specifically, for the expression (12), the processing circuitry 131 defines a cost function similarly to the expression (5). The processing circuitry 131 calculates the vector a'', which is a combination of the 0-order, first-order, and second-order shimming values, by the least-squares method with which the cost function relating to the expression (12) is minimized.

Next, a method of acquiring a resonance frequency distribution by the acquisition function 1317 is described.

A resonance frequency distribution of each of water and fat can be collected by the three-point Dixon method. With the three-point Dixon method, three patterns of image each having a different phase relationship between a signal emitted from a fat and a signal emitted from water are collected with the use of a phase difference between water and fat. Specifically collected are: a first image obtained when a fat signal is in phase with a water phase, a second image obtained when a signal emitted from fat is an antiphase to a signal emitted from water, and a third image obtained when a signal emitted from fat is an antiphase to a signal emitted from water and the phase relationship indicated therein is different from that of the second image. With the use of the first, second, and third images, a resonance frequency distribution of water and a resonance frequency distribution of fat in which influence of magnetic field inhomogeneity is corrected can be acquired.

By executing the acquisition function 1317, the processing circuitry 131 may perform imaging to a magnitude image based on a phase difference obtained by the static magnetic field shimming in step S202, and acquire resonance frequency distributions of water and fat. In other words, from two phase-difference images obtained by the static magnetic field shimming, a resonance frequency distribution of water and a resonance frequency distribution of fat can be obtained, in a manner similar to the acquisition with the three-point Dixon method.

The resonance frequency distributions for the static magnetic field shimming may be collected with the use of presence/absence of fat suppression pulse (prepulse). The resonance frequency distributions of water and fat may be acquired from an image in which fat is suppressed by the STAIR method or the STIR method, and an image in which fat is not suppressed.

Next, types of fat suppression pulse and their frequency characteristics as examples of a frequency-selective pulse are described with reference to FIG. 3.

Figure 3:
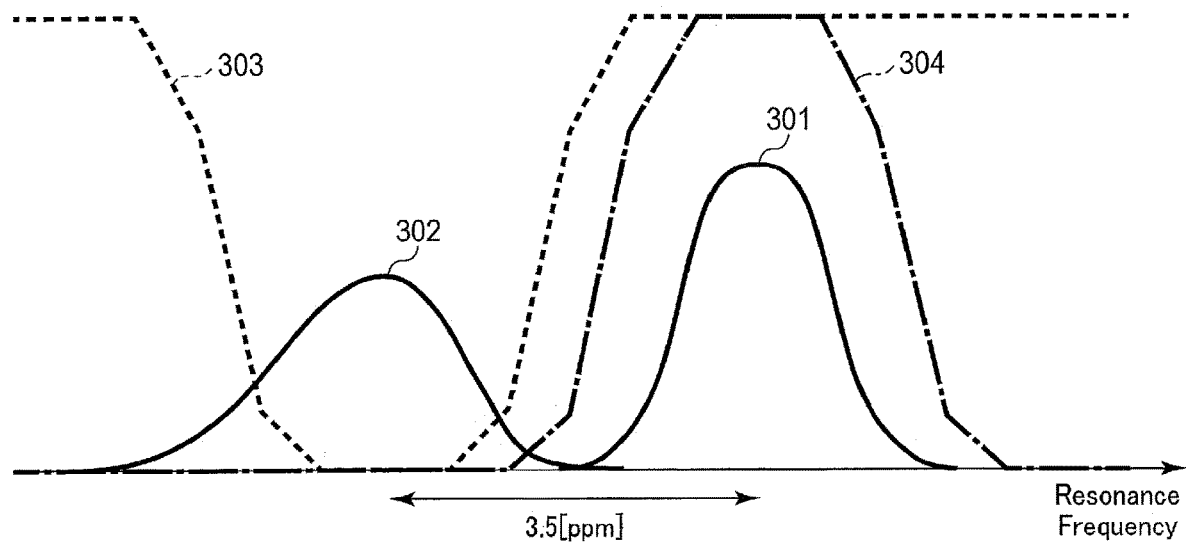
FIG. 3 is a diagram explaining types of fat suppression pulses and their frequency characteristics in the embodiment.

FIG. 3 shows the resonance frequency distribution of water 301 and the resonance frequency distribution of fat 302. As an example of a frequency-selective pulse, the frequency characteristic 303 in the SPAIR method, which is a fat suppressing-type fat suppression method, is shown with the aid of a dashed line.

With the SPAIR method, a fat suppression pulse (prepulse) is applied in accordance with a resonance frequency of fat, so that a resonance frequency of fat is not selected. Subsequently, an excitation pulse is applied, and MR signals are collected after an inversion time (TI), at which vertical magnetization of fat becomes a null point, elapses. Thus, as shown by the frequency characteristic 303 in FIG. 3, frequencies can be selected so that only MR signals of water are collected.

By executing the calculation function 1319, the processing circuitry 131 calculates a center frequency of a fat suppression pulse based on the resonance frequency distribution of fat 302. For example, by executing the calculation function 1319, the processing circuitry 131 may set a peak value of the resonance frequency distribution of fat 302 to a center frequency of a fat suppression pulse. It is thereby possible to suppress MR signals from fat as appropriate.

As another example of a frequency-selective pulse, the frequency characteristic 304 in the PASTA method, which is a water excitation-type fat suppression method, is shown with the aid of an alternate long and short dashed line in FIG. 3. With the PASTA method, a frequency-selective excitation pulse is applied to excite and emphasize signals emitted from water, and fat is thereby suppressed relatively to water.

To apply an excitation pulse, by executing the calculation function 1319, the processing circuitry 131 may set a peak value of the resonance frequency distribution of water 301 to a center frequency of the excitation pulse. It is thereby possible to emphasize signals emitted from water as appropriate and suppress signals emitted from fat relative to the signals emitted from water.

Figure 4:
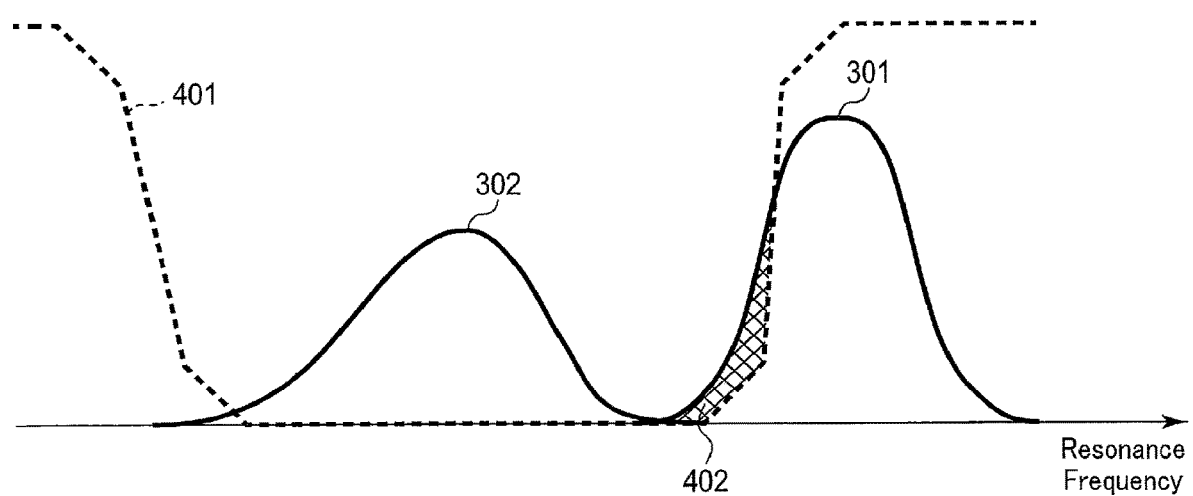
FIG. 4 is a diagram showing an example where penalty is set for optimization of center frequencies in the embodiment.

For example, by executing the image generation function 1313, the processing circuitry 131 may display the resonance frequency distributions of water and fat, the frequency characteristic of a frequency-selective pulse, and a result of fat suppression estimated from a display of the combinations of the distributions and characteristics, in the form of a graph on a display 127, as shown in FIGS. 3 through 5. It is thereby possible to visualize information described above and display the same to an operator.

By executing the calculation function 1319, the processing circuitry 131 may optimize a center frequency of a frequency-selective pulse in consideration, with priority, of a target region in an imaging range. The imaging range may be determined by a range designation manually input by a user to a locator image, for example. The imaging range may be, for example, a common automatic detection result corresponding to a magnetic field center, an imaging center, and an examination-targeted part.

When a fat suppression pulse adjusted to the calculated center frequency is applied, a penalty may be calculated in accordance with the size of a region in which the resonance frequency distribution of water is suppressed, or a region in which fat is excited by a water-exciting-type excitation pulse.

The setting of a penalty in the optimization of a center frequency is described with reference FIGS. 4 and 5.

FIG. 4 shows resonance frequency distributions of water and fat, similarly to FIG. 3. The frequency characteristic 401 in the SPAIR method is also shown in FIG. 4.

The region 402 surrounded by the frequency characteristic 401 in the SPAIR method and the resonance frequency distribution of water 301 is a region where the fat suppression pulse partially suppresses the frequency component of water. A penalty value is set in such a way that the penalty increases as the region 402 becomes larger. By execution of the calculation function 1319, the processing circuitry 131 calculates a penalty value based on the area size of the region 402. The processing circuitry 131 may change a pulse width of the frequency-selective pulse if a penalty value calculated by the calculation function 1319 becomes greater than a threshold value.

In the example shown in FIG. 4, the pulse width of the fat suppression pulse in the SPAIR method is wide, and the pulse suppresses the frequency component of water, not only the frequency component of fat suppression. Thus, By executing of the calculation function 1319, the processing circuitry 131 may narrow the pulse width of a fat suppression pulse so as not to suppress the frequency component of water.

FIG. 5 shows resonance frequency distributions of water and fat, similarly to FIGS. 3 and 4. The frequency characteristic 403 in the PASTA method is also shown.

The region 404 surrounded by the frequency characteristic 403 in the PASTA method and the resonance frequency distribution of fat 302 is a region where an excitation pulse excites and emphasizes a frequency component of fat. Also in this case, By executing of the calculation function 1319, the processing circuitry 131 changes the pulse width of the frequency-selective pulse if the penalty value based on the area size of the region 404 becomes greater than a threshold value.

In the example shown in FIG. 5, the pulse width of the frequency characteristic 403 in the PASTA method is wide, and the frequency component of fat is also excited. Accordingly, By executing of the calculation function 1319, the processing circuitry 131 can narrow the pulse width of the frequency-selective pulse so as not to excite the frequency component of fat.

According to the above-described present embodiment, a resonance frequency distribution is calculated for each tissue, such as water and fat, and a center frequency of a frequency-selective pulse is determined from a resonance frequency distribution of tissue targeted for suppression or excitation when the frequency-selective pulse is applied. By applying the frequency-selected pulse at the determined center frequency, it is possible to accurately suppress a frequency component of tissue needing to be suppressed, or to accurately excite a frequency component of tissue needing to be excited. As a result, it is possible to improve the fat suppression effect by a fat suppression pulse, for example, and improve image quality of an MR image based on collected MR signals.

In the present embodiment, second-order or higher components are considered in terms of inhomogeneity of a static magnetic field; however, if magnitude of the static magnetic field is not so large (for example, 1.5 T), 0-order and first-order components are corrected but higher-order components need not be corrected. In this case, the MRI apparatus 1 need not include a shim coil 101 and a shim coil power supply 102.

Furthermore, the functions described in connection with the above embodiments may be implemented, for example, by installing a program for executing the processing in a computer, such as a work station, etc., and expanding the program in a memory. The program that causes the computer to execute the processing can be stored and distributed by means of a storage medium, such as a magnetic disk (a hard disk, etc.), an optical disk (CD-ROM, DVD, Blu-ray (registered trademark) etc.), and a semiconductor memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising processing circuitry configured to:
    acquire a first resonance frequency distribution of a first tissue and a second resonance frequency distribution of a second tissue which is different from the first tissue;
    calculate a center frequency of a frequency-selective prepulse that suppresses or emphasizes either one of the first tissue and the second tissue in accordance with the first and second resonance frequency distributions; and
    apply the frequency-selective prepulse at the calculated center frequency and thereafter apply an RF pulse to collect a magnetic resonance signal.

2. The apparatus according to claim 1, wherein
    the processing circuitry acquires the first and second resonance frequency distributions with the use of a three-point Dixon method.

3. The apparatus according to claim 1, wherein
    the processing circuitry acquires the first and second resonance frequency distributions based on a magnitude image that is obtained by static magnetic field shimming.

4. The apparatus according to claim 1, wherein
    the frequency-selective prepulse is a prepulse for fat suppression.

5. The apparatus according to claim 1, wherein
    the frequency-selective prepulse is a prepulse for water excitation.

6. The apparatus according to claim 1, wherein the processing circuitry is further configured to display the first and second resonance frequency distributions, a frequency characteristic of the frequency-selective prepulse, and an estimated result of fat suppression.

7. The apparatus according to claim 1, wherein
    the processing circuitry optimizes a center frequency based on a target region in an imaging range.

8. The apparatus according to claim 1, wherein
the processing circuitry calculates the center frequency in accordance with a type of the frequency-selective pulse and each of the acquired first and second resonance frequency distributions.

9. A magnetic resonance imaging method comprising:
acquiring a first resonance frequency distribution of a first tissue and a second resonance frequency distribution of a second tissue which is different from the first tissue;
calculating a center frequency of a frequency-selective prepulse that suppresses or emphasizes either one of the first tissue and the second tissue in accordance with the first and second resonance frequency distributions; and
applying the frequency-selective prepulse at the calculated center frequency and thereafter applying an RF pulse to collect a magnetic resonance signal.

10. The method according to claim 9, wherein
the first and second resonance frequency distributions are acquired with the use of a three-point Dixon method.

11. The method according to claim 9, wherein
the first and second resonance frequency distributions are acquired based on a magnitude image that is obtained by static magnetic field shimming.

12. The method according to claim 9, wherein
the frequency-selective prepulse is a prepulse for fat suppression.

13. The method according to claim 9, wherein
the frequency-selective prepulse is a prepulse for water excitation.

14. The method according to claim 9, further comprising displaying the first and second resonance frequency distributions, a frequency characteristic of the frequency-selective prepulse, and an estimated result of fat suppression.

15. The method according to claim 9, further comprising optimizing a center frequency based on a target region in an imaging range.

16. The method according to claim 9, wherein
the center frequency is calculated in accordance with a type of the frequency-selective pulse and each of the acquired first and second resonance frequency distributions.

* * * * *